United States Patent
Kang et al.

(10) Patent No.: US 10,964,550 B2
(45) Date of Patent: Mar. 30, 2021

(54) METHOD AND APPARATUS FOR SURFACE PLANARIZATION OF OBJECT USING LIGHT SOURCE OF SPECIFIC WAVELENGTH AND REACTIVE GAS

(71) Applicant: KOREA INSTITUTE OF SCIENCE AND TECHNOLOGY, Seoul (KR)

(72) Inventors: Gumin Kang, Seoul (KR); Il Ki Han, Seoul (KR); S. Joon Kwon, Seoul (KR); Young-Hwan Kim, Seoul (KR); Hyungduk Ko, Seoul (KR); Chun Keun Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/270,594

(22) Filed: Feb. 8, 2019

(65) Prior Publication Data
US 2019/0333779 A1 Oct. 31, 2019

(30) Foreign Application Priority Data
Apr. 25, 2018 (KR) .................. 10-2018-0047899

(51) Int. Cl.
*H01L 21/321* (2006.01)
*H01L 21/66* (2006.01)
(Continued)

(52) U.S. Cl.
CPC .. *H01L 21/32115* (2013.01); *H01L 21/30604* (2013.01); *H01L 21/30621* (2013.01);
(Continued)

(58) Field of Classification Search
None
See application file for complete search history.

(56) References Cited

U.S. PATENT DOCUMENTS

| | | | |
|---|---|---|---|
| 4,828,874 A | 5/1989 | Hiraoka et al. | |
| 6,036,876 A | * 3/2000 | Chen | ............... H01L 21/32136 216/67 |

(Continued)

FOREIGN PATENT DOCUMENTS

| | | |
|---|---|---|
| KR | 1020030012365 A | 2/2003 |
| KR | 1020040092728 A | 11/2004 |

(Continued)

OTHER PUBLICATIONS

Makoto Naruse et al., "Unveiling the mechanisms of dressed-photon-phonon etching based on hierarchical surface roughness measure," Applied Physics Letters, 2013, 5 pages, vol. 102, No. 071603, The American Institute of Physics.

(Continued)

*Primary Examiner* — Roberts P Culbert
(74) *Attorney, Agent, or Firm* — Cantor Colburn LLP

(57) ABSTRACT

A method for surface planarization of an object using a light source of a specific wavelength according to an embodiment includes: providing an object in a main chamber; injecting an etching gas into the main chamber; inputting the light source of a specific wavelength onto a surface of the object; and controlling a temperature of the object. According to the method, it is possible to minimize the side effects such as scratches or contamination of the sample that occur in a conventional chemical-mechanical planarization process. In addition, it is possible to allow precise planarization in nanometers (nm) and simultaneously perform planarization to a side surface of a device as well as a large-sized surface, thereby reducing cost and time required for the planarization process. Moreover, since the surface roughness and the electrical conductivity are improved, it is possible to increase the efficiency and output of the LED device.

10 Claims, 7 Drawing Sheets

(51) Int. Cl.
  *H01L 21/3105* (2006.01)
  *H01L 21/306* (2006.01)

(52) U.S. Cl.
  CPC .. *H01L 21/31055* (2013.01); *H01L 21/31058* (2013.01); *H01L 22/26* (2013.01)

(56) References Cited

U.S. PATENT DOCUMENTS

2007/0184639 A1* 8/2007 Tanaka .............. H01L 27/11226
                                                                       438/487
2014/0263180 A1* 9/2014 Moffatt ................... C23C 16/00
                                                                       216/62
2015/0249016 A1* 9/2015 Titus ................. H01L 21/67103
                                                                       438/9

FOREIGN PATENT DOCUMENTS

KR    1020050072598 A    7/2005
KR    1020060074536 A    7/2006
KR       100846960 B1    7/2008

OTHER PUBLICATIONS

Takashi Yatsui et al., "Realization of Ultraflat Plastic Film Using Dressed-Photon-Phonon-Assisted Selective Etching of Nanoscale Structures," Advances in Optical Technologies, 2014, 5 pages, vol. 2015, No. 701802, Hindawi Publishing Corporation.

Yimin Yang et al., "Surface-enhanced Raman spectroscopy on transparent fume-etched ITO-glass surface," Applied Surface Science, 2014, pp. 250-254, vol. 309, Elsevier B.V.

J. Kohler et al., "Laser Induced Etching of Silicon with Fluorine and Chlorine and with Mixtures of Both Gases," Laser in deer Technik, Proceedings of the 11th International Congress, 1994, pp. 820-821.

* cited by examiner

METHOD AND APPARATUS FOR SURFACE PLANARIZATION OF OBJECT USING LIGHT SOURCE OF SPECIFIC WAVELENGTH AND REACTIVE GAS

CROSS-REFERENCE TO RELATED APPLICATION

This application claims priority to Korean Patent Application No. 10-2018-0047899, filed on Apr. 25, 2018, and all the benefits accruing therefrom under 35 U.S.C. § 119, the contents of which in its entirety are herein incorporated by reference.

BACKGROUND

1. Field

The present disclosure relates to a method and apparatus for surface planarization using a light source of a specific wavelength, and more particularly, to a planarization method and apparatus for removing minute protrusions on a surface of an object in a non-contacting way by using a light source of a specific wavelength and an etching reactive gas.

2. Description of the Related Art

Indium tin oxide (ITO) is a substance where about 5 to 10% of tin (Sn) is added to indium oxide, and has a feature in that it is transparent while having conductivity for allowing electrical conduction. Generally, a conductive material such as a metal absorbs or reflects visible light without transmitting it, but ITO has an advantage of transmitting visible light of 90% or more. Due to this advantage, ITO has been widely used as a material for an electrode of a display panel or LED since the 2000 s.

A sputtering method is generally used to deposit ITO on a semiconductor device. In the sputtering method, plasma is generated at high vacuum, so that an ionized gas such as argon is accelerated and collided with a target to eject a desired atom and form a film on a substrate in the vicinity thereof. The ITO film deposited as above has an amorphous structure. Commercially available ITO film products have a surface roughness of about 2 to 10 nm (RMS), and the surface roughness of the ITO films directly or indirectly affects the leakage current of the semiconductor device and the luminous efficiency of the LED.

A chemical mechanical polishing (CMP) method is generally used for planarization of the surface of the ITO film. The CMP method is a planarization method of polishing the surface of a sample in a physical/chemical manner by using a polishing agent called a slurry, and this method is effective on the reduction of the surface roughness. However, since the polishing agent must directly contact the sample such as an ITO film, the surface of a substrate may be easily scratched or contaminated by the polishing agent or the like. In addition, if a device having a complicated structure is fabricated, the height of the surface of the sample is not uniform, and thus it is difficult to perform planarization by the CMP method.

In order to solve the above problems, a method of heating a partial region of a substrate on which the ITO film is deposited and then plasma-etching the entire surface, so that planarization is performed using the difference in etch rates between the partial region and other regions is proposed. However, this method is not suitable for minute planarization operation in nanometer (nm) because it utilizes the temperature difference inside the substrate.

In addition, since the inner crystal of the ITO film has a grain structure, there is a limitation in the duration of the planarization due to its structural characteristics. Thus, it is demanded to develop a non-contact type planarization method in consideration of the above.

SUMMARY

The present disclosure is directed to providing a method and apparatus for surface planarization using a light source of a specific wavelength. Specifically, the present disclosure is directed to providing a non-contact type planarization method for removing minute protrusions on a surface of an object by using a light source of a specific wavelength and at least one etching reactive gas among $Cl_2$, $Br_2$, $CF_4$, $SF_6$ and HBr, and an apparatus for performing the method.

According to the present disclosure, it is possible to minimize side effects such as scratches or contamination of a sample as compared with the conventional planarization method such as CMP, and also enable fine control in nanometers (nm).

In one aspect, there is provided a method for surface planarization of an object using a light source of a specific wavelength, comprising: providing an object, to which planarization is to be performed, in a main chamber; injecting an etching gas into the main chamber; inputting the light source of a specific wavelength onto a surface of the object; and controlling a temperature of the object, wherein the surface of the object is planarized by interaction between the injected etching gas and the inputted light source.

In an embodiment, the etching gas may be is at least one of $Cl_2$, $Br_2$, $CF_4$, $SF_6$ and HBr.

In an embodiment, the wavelength of the light source may be determined based on at least the kind of the etching gas, so that the light source has energy lower than the dissociation energy of the etching gas.

In an embodiment, in the controlling a temperature of the object, the temperature may be controlled so that the temperature of the entire surface of the object to which the light source is input becomes uniform.

In an embodiment, the controlling a temperature of the object may include: monitoring a roughness of the surface of the object; and controlling the temperature of the object again based on the monitoring result.

In an embodiment, the controlling a temperature of the object may be performed by heating using an electrode connected to a heating plate to which the object is attached.

In an embodiment, the light source may be formed to have uniform distribution by using a beam shaping lens.

In an embodiment, the light source may have a visible light wavelength band.

In an embodiment, the object may be a film made of at least one of ITO, FTO, ZnO, $TiO_2$, $SnO_2$, AZO (aluminum-doped ZnO) and GZO (gallium-doped ZnO).

In an embodiment, the inputting the light source of a specific wavelength onto a surface of the object may be continuously performed until immediately before the roughness of the surface of the film is increased again due to the decrease of a size of grains of the film.

In an embodiment, the object may be selected from silicon (Si), III-IV compound semiconductors, oxide materials and organic polymers.

In another aspect of the present disclosure, there is also provided an apparatus for surface planarization of an object using a light source of a specific wavelength, comprising: a main chamber in which the object is provided; a gas injection unit (e.g. gas injector) configured to inject an etching gas into the main chamber; a light source emission unit (e.g. light source or light source emitter) configured to input the light source of a specific wavelength; and a temperature control unit (e.g. temperature controller) configured to control a temperature of the object, wherein the temperature control unit controls the temperature so that the temperature of the entire surface of the object to which the light source is input becomes uniform.

In an embodiment, the temperature control unit may include a monitoring unit configured to monitor a roughness of the surface of the object while the surface planarization is being performed to the object.

In an embodiment, the apparatus may further comprise a beam shaping lens configured to allow the light source to have uniform distribution.

In the method and apparatus for surface planarization using a light source of a specific wavelength according to an embodiment of the present disclosure, minute protrusions on the surface of an object (for example, an oxide such as ITO, FTO, ZnO, $TiO_2$, $SnO_2$, AZO (aluminum-doped ZnO) and GZO (gallium-doped ZnO) or an organic polymer) surface are removed. Here, the planarization is performed in a non-contact type by using a light source of a specific wavelength (for example, by using a 532 nm laser for an ITO film) and an etching reactive gas containing a halogen compound. Accordingly, it is possible to minimize the side effects such as scratches or contamination of the sample that occur in the conventional planarization method using a CMP process. In addition, this method may reduce the cost and time required for the planarization process because the process difficulty is low.

According to an embodiment of the present disclosure, it is possible to allow precise planarization in nanometers (nm), and it is possible to simultaneously perform planarization to a side surface of a device as well as a large-sized surface, thereby reducing cost and time required for the planarization process. As a result, the surface roughness and the electric conductivity are improved, and so it is possible to increase the efficiency and output of the LED device.

The present disclosure may be applied various materials such as polycrystalline materials having grain boundaries like ITO and FTO, semiconductors such as silicon (Si) and III-IV compounds, organic materials such as oxide materials or photoresists, and the like. Since three-dimensional planarization may be performed to various materials, it is possible to improve the performance of various devices.

DETAILED DESCRIPTION

Reference will now be made to the accompanying drawings, which illustrate, by way of illustration, specific embodiments in which the present disclosure may be implemented. These embodiments are described in sufficient detail to enable those skilled in the art to implement the present disclosure. It should be understood that various embodiments of the present disclosure are different, but need not be mutually exclusive. For example, specific shapes, structures and characteristics described herein may be realized in other embodiments without departing from the scope of the present disclosure in connection with the embodiments. It should also be understood that positions or arrangements of individual components in each embodiment may be varied without departing from the scope of the present disclosure. The following detailed description is, therefore, not to be taken in a restricting sense, and the scope of the present disclosure is defined only by the appended claims, along with the full scope of equivalents to the claims.

Hereinafter, embodiments of the present disclosure will be described in detail with reference to the drawings.

Figure 1:
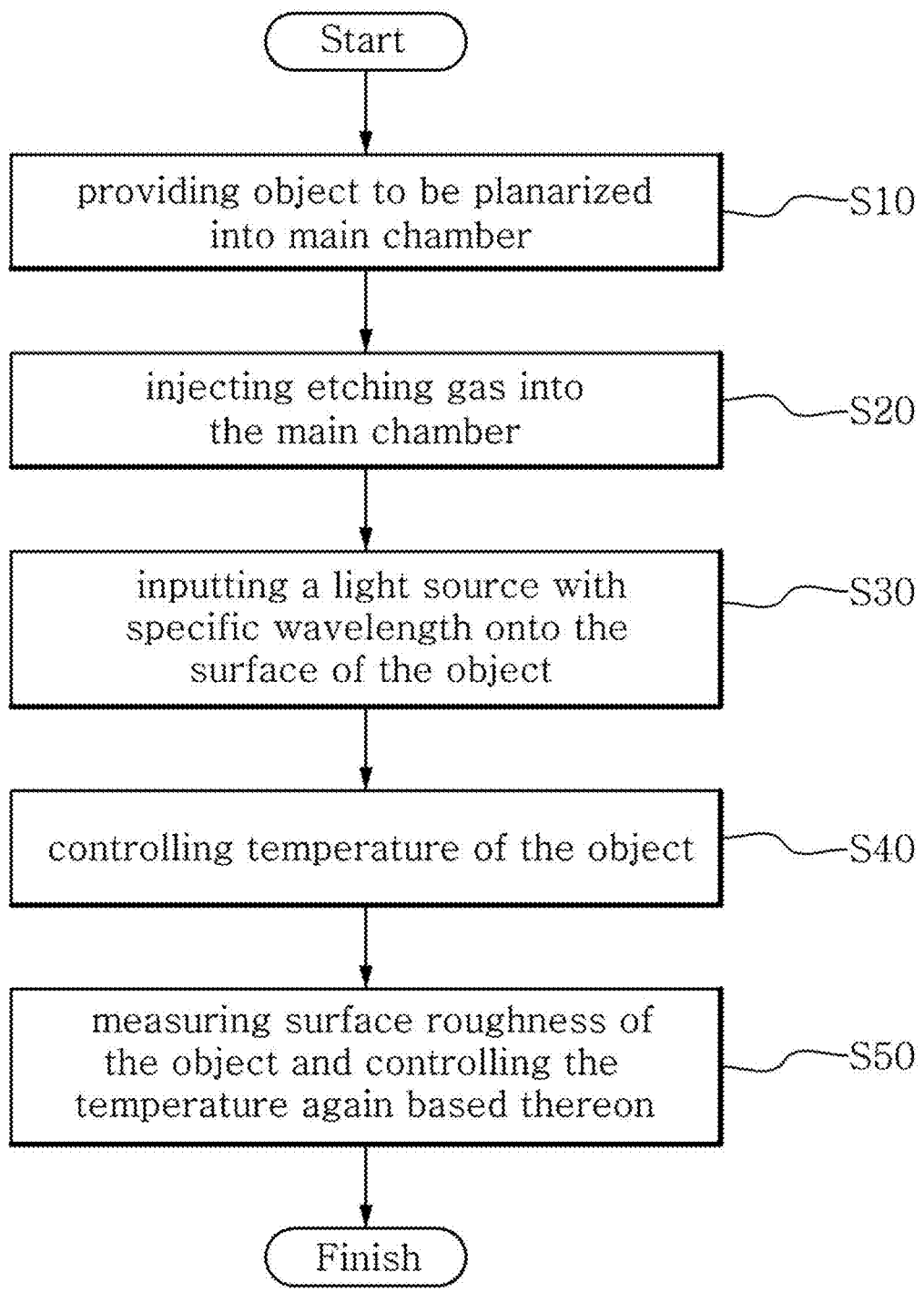
FIG. 1 is a flowchart for illustrating each step of a method for surface planarization of an object using a light source of a specific wavelength according to an embodiment.

FIG. 1 is a flowchart for illustrating each step of a method for surface planarization of an object using a light source of a specific wavelength according to an embodiment. In the present disclosure, the surface planarization is performed by means of the interaction of the dressed photon phonon (DPP) at the surface protrusion of an object. In this process, if light of an appropriate wavelength is input to the object exposed to a reactive gas environment, gas is decomposed and radicals are generated to selectively etch the protrusions of the surface, thereby performing the planarization.

Prior to the planarization process according to the embodiment, in step S10, an object subject to planarization is provided in a main chamber. The object may be an oxide material having a grain structure such as an ITO or FTO film and may be selected from silicon (Si), III-IV compound semiconductors and organic polymers. However, they are only examples, and the planarization method using a light source according to this embodiment may be applied to various materials. Thus, the object is not limited to a specific material. For example, the planarization of the present disclosure may be applied to materials that are difficult to be physically flattened, such as diamond, and in this case, $O_2$ gas may be used as an activation gas.

Figure 2:
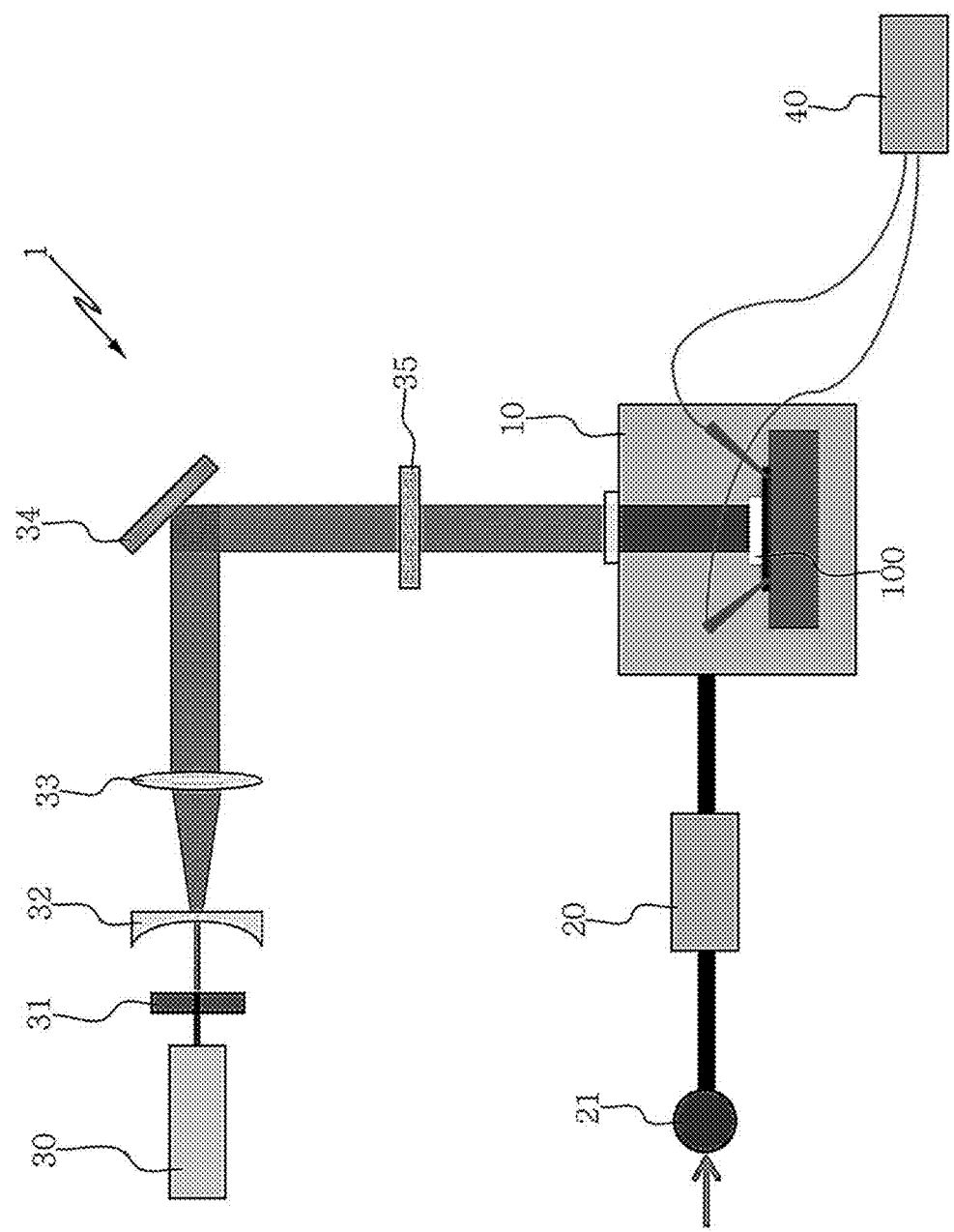
FIG. 2 is a diagram showing an apparatus for surface planarization of an object using a light source of a specific wavelength according to an embodiment.

Referring to FIG. 2, the main chamber 10 gives an isolated space in which an object subject to planarization is provided. In the internal environment of the main chamber 10 in which the etching gas is injected, a planarization process is performed to remove the protrusions on the surface of the object by using a light source. For the planarization process, the object is fixed in a reactor of the main chamber 10. According to an embodiment, the main chamber 10 may have a pressure control range from 10 Torr to 760 Torr, and the planarization process may be performed generally under a pressure of 1 to 2 Torr. The main chamber 10 may further include a vacuum gauge for measuring the internal pressure and the degree of vacuum.

If the process starts, in step S20, an etching gas is injected into the main chamber. After that, the etching gas (for example, $Cl_2$ gas) environment composed of a halogen compound is formed inside the main chamber. The etching gas includes a reactive gas. For example, the etching gas may include a halogen compound gas capable of performing planarization onto the surface of the object together with a light source, such as $Cl_2$, $Br_2$, $CF_4$, $SF_6$, HBr and the like, without being limited thereto.

As shown in FIG. 2, if a gas valve 21 is opened, the etching gas may be injected by using a gas injection unit 20. The gas injection unit 20 may include a regulator for injecting the etching gas into the main chamber at a constant pressure. Since the optimum conditions for the planarization process may vary depending on the flow rate of the etching gas, a user may control the flow rate of the etching gas in consideration of other variables affecting the planarization process. In an embodiment, a gas flow regulator may additionally be used to control the flow rate of the etching gas injected into the main chamber.

Next, in step S30, a light source of a specific wavelength is input onto the surface of the object. As shown in FIG. 2, the light source of a specific wavelength is emitted using a light source emission unit 30. Here, the wavelength of the light source may be determined based on the kind of the object subject to planarization, the kind of etching gas, and the like. For example, if the object is an ITO film and $Cl_2$ gas is used as the etching gas, the planarization process may be performed using visible light with a frequency of 532 nm. In this case, the energy of the incident light increases as the $Cl_2$ is decomposed by the 532 nm laser, and the object is etched by the interaction of the Cl radical and the ITO.

In an embodiment, the wavelength of the light source may be determined based on the kind of etching gas (e.g., at least one of $Cl_2$, $Br_2$, $CF_4$, $SF_6$ and HBr). Specifically, the light preferably has energy lower than the dissociation energy of the etching gas. For example, if the etching gas is $Cl_2$, visible light with a center wavelength of 494 nm or above may be used for planarization. As another example, if the etching gas is $Br_2$, visible light with a center wavelength of 623 nm or above may be used.

The light source emitted from the light source emission unit 30 passes through a concentration lens 31, during which its light intensity may be adjusted to a desired level. After that, the light source passes through a plano-concave lens 32 and a plano-convex lens 33.

For the laser light source (for example, 2 mm) passing through the concentration lens 31 to have a uniform rectangular distribution through a beam shaping lens 35, which is a kind of diffractive optical elements, explained later, a collimated laser beam of a size (for example, 5 mm) suitable for the specifications of the beam shaping lens 35 is required.

A set of a plano-concave lenses 32 and a plano-convex lenses 33 may be used to increase the size of the laser beam and simultaneously make the laser beam into a collimated laser beam. The plano-concave lens 32 serves to increase the beam size by expanding the beam, and the plano-convex lens 33 serves to convert the expanded beam into a collimated laser beam of a uniform size.

Next, the direction of the light source input to the main chamber 10 may be controlled using a mirror 34 shown in FIG. 2. In an embodiment, the mirror is designed to tilt two-axially and adjusts the direction of the light beam so that the light beam may be incident to a point inside the reactor where the object 100 needs to be subject to planarization. Accordingly, unlike the conventional physical planarization process such as chemical mechanical polishing (CMP), the present disclosure allows minute control in nanometers (nm).

In an embodiment, a beam shaping lens 35 may be further provided to make the light source uniformly distributed. The beam shaping lens 35 converts a laser beam having a Gaussian distribution intensity into a laser beam having a uniform rectangular distribution. Accordingly, the planarization may be performed identically in the entire region to which the laser is irradiated, thereby solving the problem that the planarization is performed differently in the planarization process depending on the positions to which the laser is irradiated.

The degree of planarization of the object may vary depending on variables such as wavelength, thickness, intensity and the like of the visible light. The user obtains visible light having characteristics suitable for the planarization process by using the light source control devices 30 to 35.

The light source is input into the main chamber 10 through an opening. The main chamber 10 gives an isolated space in which a device subject to planarization is provided, and a planarization process is performed to remove protrusions on the surface of the object 100 by using a light source of a specific wavelength in an internal environment into which an etching gas is injected. In an embodiment, the opening includes a window made of a transparent quartz, and the visible light is input through the window. The size of the window may be set proportional to the size of the sample. When the light of a specific wavelength is input onto the surface of the object, the interaction of the dressed photon phonon (DPP) occurs at the protrusions of the surface, thereby performing the planarization process. If the light of an appropriate wavelength is input to an object exposed to the etching gas environment, the planarization is performed by selectively etching the protrusions of the surface while decomposing the gas and generating radicals.

Figure 3A:
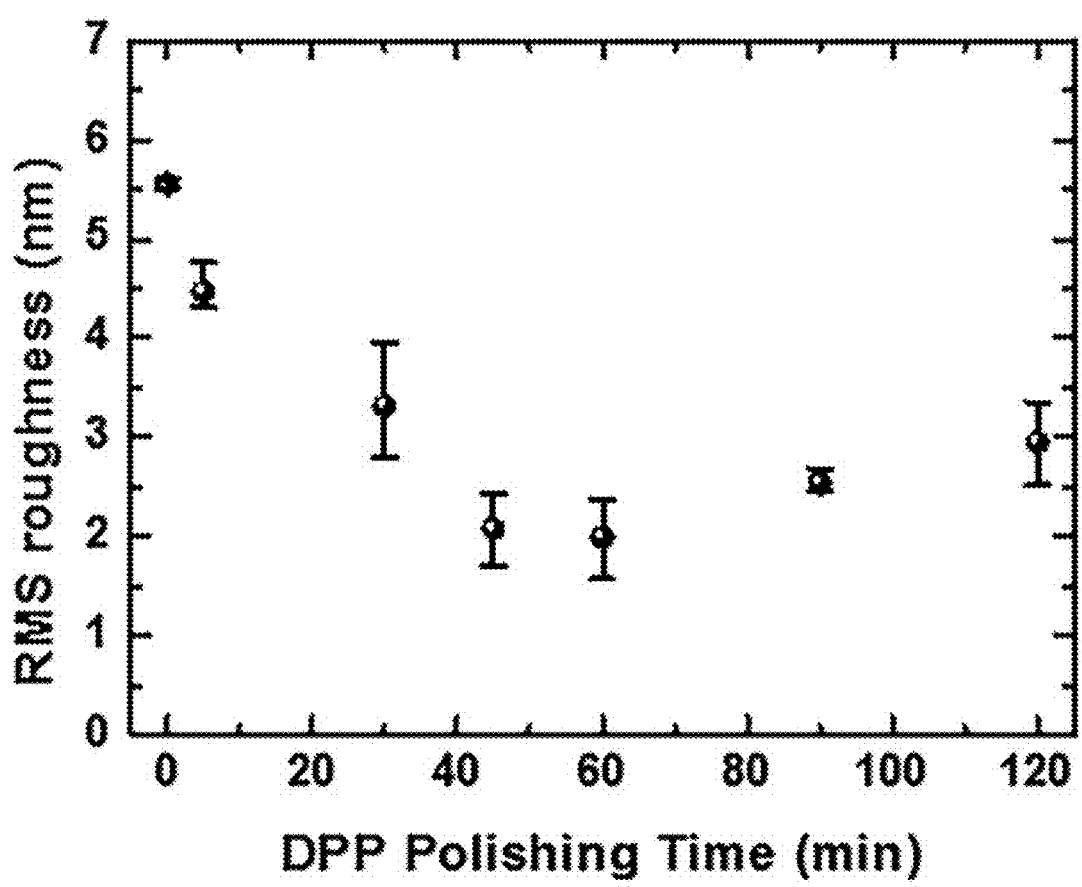
FIG. 3A is a graph showing the change of roughness of an ITO film surface according to time, when the planarization method according to an embodiment is used.

FIG. 3A is a graph showing the change of roughness of an ITO film surface according to time, when the planarization method according to an embodiment is used. In this embodiment, it is set that the etching gas uses $Cl_2$ gas and the visible light source has a center wavelength of 532 nm.

Referring to FIG. 3A, in the planarization process performed onto the surface of the ITO film by using visible light in the $Cl_2$ environment, it is found that the surface roughness of the ITO film, which has an initial roughness value (RMS roughness) of 5.5 nm or above, is lowered by about 71% after 60 minutes pass. In the conventional experiment, the roughness value is lowered by about 20% by performing the planarization process to the ITO film by using visible light. However, if the temperature of the object is controlled according to this embodiment, more excellent planarization effect may be obtained.

In step S40, the temperature of the object is controlled additionally. Experimental results show that temperature control is a very important parameter in the planarization process. For example, when a photochemical etching reaction of the ITO film occurs by a 532 nm laser and a $Cl_2$ gas, the Cl radicals formed by the laser react with the ITO to form non-volatile byproducts such as $InCl_x$ and $SnCl_x$ on the surface. At room temperature, the by-products are not easily removed, thereby hindering the continuous surface planarization process and lowering the planarization uniformity. For this reason, a device for controlling the temperature by heating the object (substrate) is required to promote desorption of the non-volatile byproducts and thus improve the process speed and the planarization uniformity.

Referring to FIG. 2, the temperature may be raised by heating the object 100 through an electrode connected to a heating plate to which the object 100 is attached, by using a temperature control unit 40. Here, the temperature may be controlled so that the entire surface of the object 100 to which the light source is input has a uniform temperature.

Figure 3B:
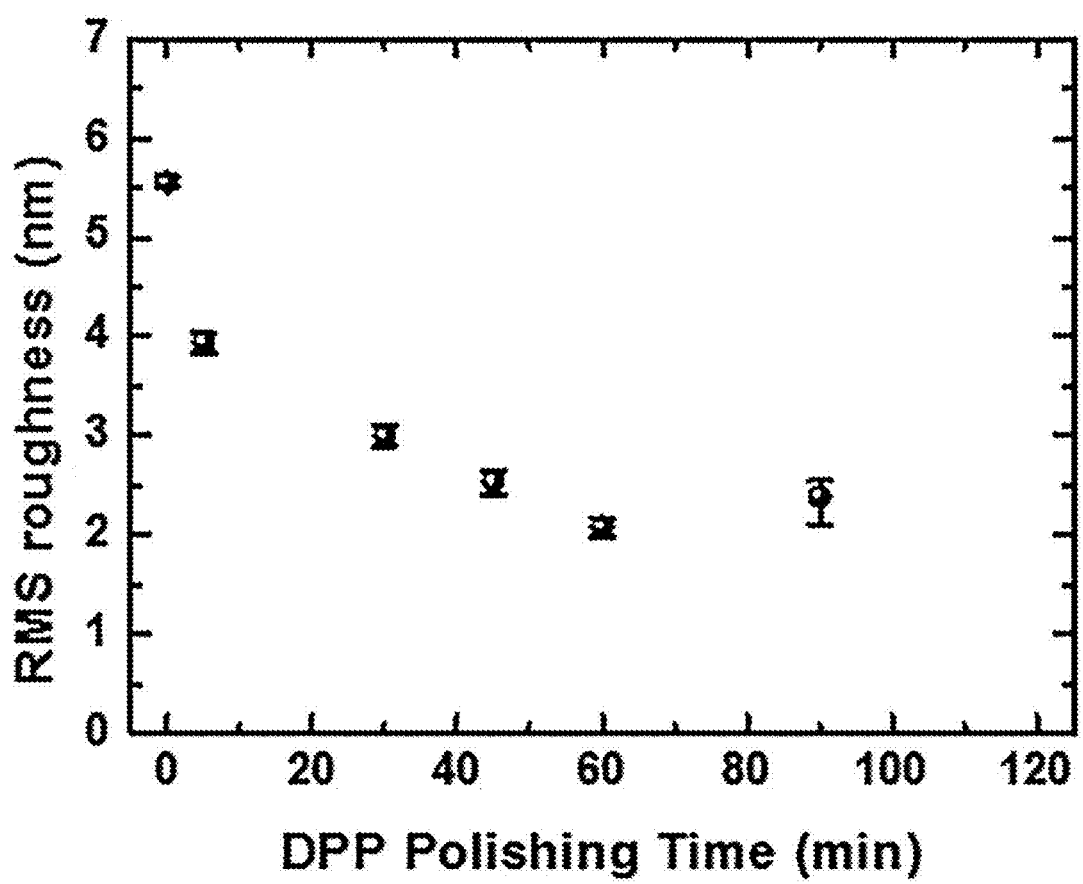
FIG. 3B is a graph showing the change of roughness of the ITO film surface according to time in an environment where temperature is controlled to about 100° C., when the planarization method according to an embodiment is used.

FIG. 3B is a graph showing the change of roughness of the ITO film surface according to time in an environment where the temperature is controlled to about 100° C. (the other experimental conditions are identical to those of FIG. 3A). In the graph of FIG. 3A, the standard deviation of the polishing uniformity is measured to be 0.31 nm. However, it may be found that in the graph of FIG. 3B, the standard deviation of the polishing uniformity is improved to 0.11 nm, and the RMS roughness of the surface is reduced by about 65% or more to improve the roughness.

Figure 3C:
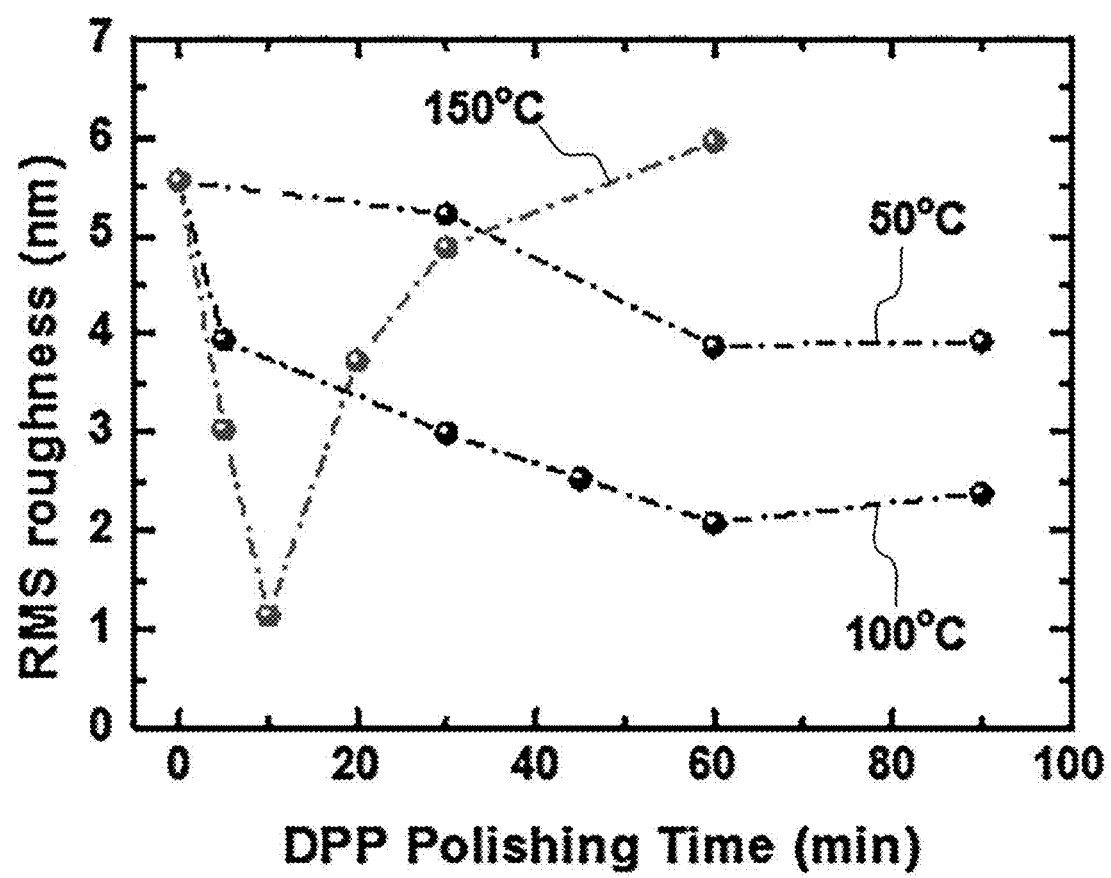
FIG. 3C is a graph showing the change of roughness of the ITO film surface according to a temperature of the object.

FIG. 3C is a graph showing the change of roughness of the ITO film surface according to a temperature condition of the object (substrate). As shown in the graph of FIG. 3C, when the temperature of the object is changed from 100° C. to 150° C., the RMS roughness is lowered from 1.55 nm to 0.72 nm in the optimal state, and the planarization process time till having a minimum value is greatly shortened from about 60 minutes to 10 minutes. That is, according to the temperature optimization, the roughness may be improved and the process speed may be greatly improved.

According to the experiment, because the degree of planarization by the light source differs depending on the temperature of the object, it is desirable to maintain the temperature of the entire surface at a similar level so that the entire surface of the object is uniformly planarized. For this purpose, the temperature control unit 40 may monitor the temperature of specific points of the object 100 in real time by using a separate temperature sensor attached to the object, and control a plurality of electrodes connected to different positions accordingly so that the temperature of the entire surface is maintained uniformly.

In step S50, monitoring the roughness of the surface of the object and controlling the temperature of the object again based on the monitoring result are performed. To this end, the temperature control unit 40 may include a monitoring unit for monitoring the roughness of the surface (the RMS roughness) while the planarization is being performed onto the surface of the object.

Figure 4:
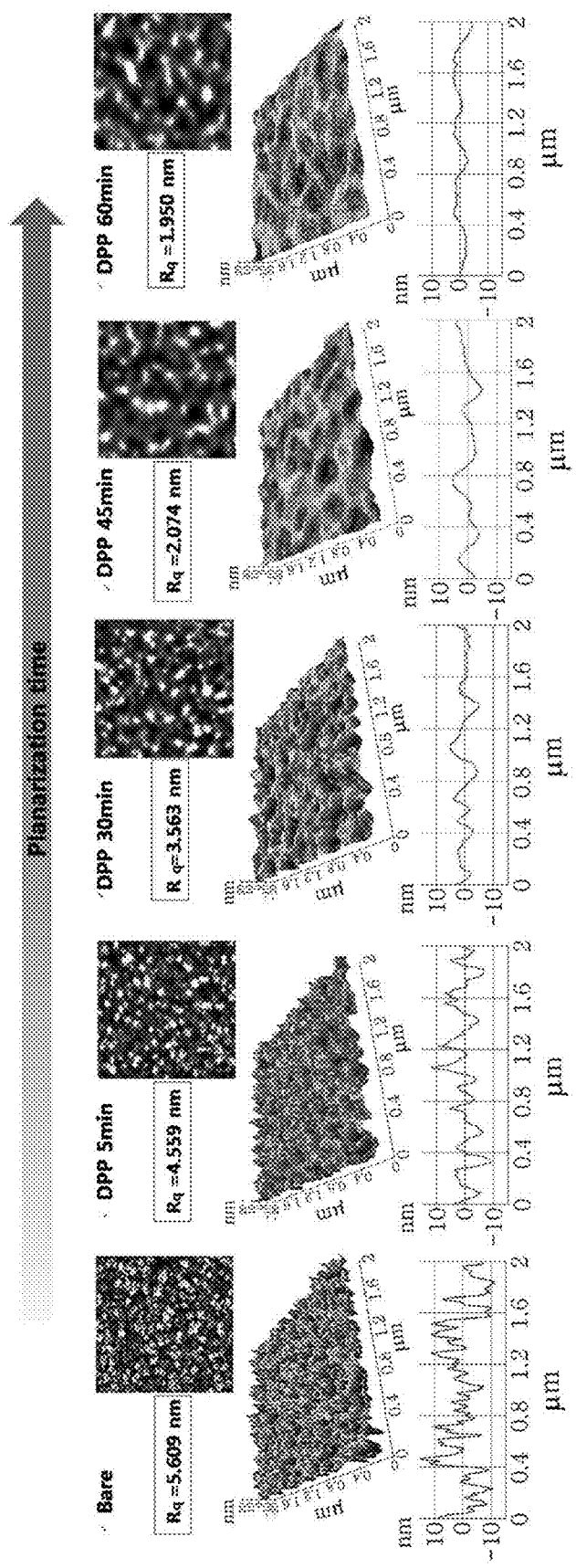
FIG. 4 shows the change of the ITO film surface according to time, observed using an atomic force microscope (AFM), when the planarization method according to an embodiment is used.

FIG. 4 shows the change of the ITO film surface according to time, observed using an atomic force microscope (AFM), when the planarization method according to an embodiment is used. As seen from portions (A) to (E) of FIG. 4, it may be understood that after the planarization process is performed for 0 to 60 minutes, the rough surface of the ITO film is improved to be smooth by the planarization process. It should be noted that the degree of roughness becomes worse if the planarization process is performed longer to the ITO film by visible light. Since the indium tin oxide (ITO) crystals have a grain structure, if the etching by visible light is performed continuously, the grain size is reduced, and thus the surface becomes rough again. Referring to FIG. 3 again, the roughness value continues to decrease until 60 minutes after the planarization process starts, and thereafter, the roughness value increases again since the grain size decrease (namely, the surface roughness becomes worse).

According to an embodiment for solving the above problem, the performing the planarization process onto the surface of the ITO film by using the input visible light may continue until immediately before the roughness of the ITO surface increases again due to the decrease of the grain size of the ITO film (for example, until 60 minutes in the experimental conditions of FIG. 3). The time t at which the roughness of the ITO surface is minimized may vary depending on the kind of the etching gas, the pressure, the flow rate, the wavelength of the visible light, the light amount, the thickness, the size of the sample, the area to be etched, and the like and thus is not limited to a specific value. An optimal value for the time may be obtained through experiments.

Figure 5:
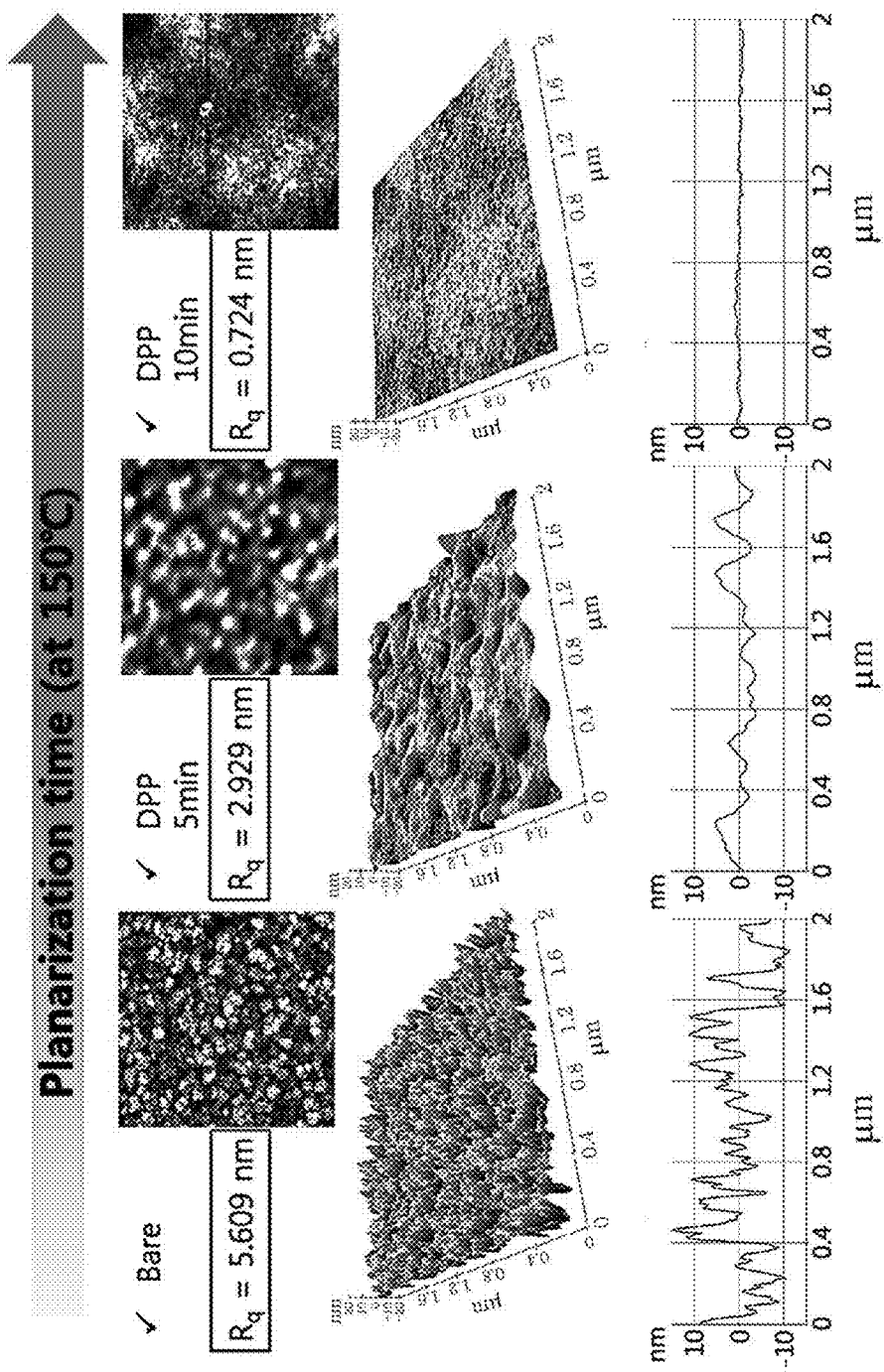
FIG. 5 shows the change of the ITO film surface according to time in an environment where temperature is controlled to about 150° C., observed using an atomic force microscope (AFM).

Meanwhile, even in this case, a more improved roughness value may be obtained when the object is controlled to optimum temperature in the temperature environment. Referring to portions (A) to (C) of FIG. 5, when the planarization process is performed for about 10 minutes at a temperature of 150° C., it may be found that the roughness value is improved by 87% as compared to the bare ITO (RMS roughness=5.61 nm).

In an embodiment, after the planarization process is completed, $N_2$ gas is injected into the main chamber 10 and an additional process of discharging the $N_2$ gas back to the outside using a pump and a gas scrubber may be performed. In this case, the etching gas (for example, $Cl_2$ gas) remaining in the main chamber 10 after the etching gas is discharged to the outside using the pump is completely removed, and thus it is possible to eliminate the risk that the user inhales the etching gas such as $Cl_2$ when the main chamber is opened.

According to the above embodiments, since the planarization process for removing minute protrusions on the surface of the object is performed in a non-contact manner using the light source of a specific wavelength and the etching gas containing a halogen compound, it is possible to minimize side effects such as scratches or contamination of the sample such as the ITO film. In addition, since the process difficulty is low, it is possible to reduce the cost and time required for the planarization process.

The techniques disclosed herein are applicable in various fields. As a result of experiments, it is confirmed that the charge mobility of ITO is improved from 4% to 28% by means of the dressed photon-phonon (DPP) planarization compared to the bare ITO. As a result, the electric conductivity and the charge mobility are improved while maintaining high transmittance, thereby realizing low-power high-speed transistors.

In addition, when the planarized ITO is applied to the field of organic solar cells, the open circuit voltage (Voc) may be increased due to the improvement of the charge mobility of the planarized ITO electrode. In addition, in the case of DPP planarization ITO-based OPV, the absolute efficiency may be improved up to 0.53% (the relative efficiency may be improved up to 22.1%).

Although the present disclosure has been described with reference to the embodiments shown in the drawings, it should be understood that various changes and modifications may be made thereto without departing from the scope of the present disclosure by those skilled in the art. However, such modifications should be considered to fall within the scope of the present disclosure. Accordingly, the true scope of the present disclosure should be defined by the appended claims.

What is claimed is:

1. A method for surface planarization of an object using a light source of a specific wavelength, comprising:
   providing an object, to which planarization is to be performed, in a main chamber;

injecting an etching gas into the main chamber;
inputting the light source of a specific wavelength onto a surface of the object; and
controlling a temperature of the object,
wherein the object is a film, and the inputting of the light source of the specific wavelength onto the surface of the object is continuously performed until immediately before a roughness of the surface of the film is increased again due to a decrease of a size of grains of the film.

2. The method for surface planarization of an object using a light source of a specific wavelength according to claim 1, wherein the etching gas is at least one of $Cl_2$, $Br_2$, $CF_4$, $SF_6$ and HBr.

3. The method for surface planarization of an object using a light source of a specific wavelength according to claim 2, wherein the wavelength of the light source is determined based on at least the kind of the etching gas.

4. The method for surface planarization of an object using a light source of a specific wavelength according to claim 1, wherein in the controlling of the temperature of the object, the temperature is controlled so that the temperature of an entire surface of the object to which the light source is input becomes uniform.

5. The method for surface planarization of an object using a light source of a specific wavelength according to claim 4, wherein the controlling of the temperature of the object includes:
monitoring the roughness of the surface of the object; and
controlling the temperature of the object again based on the monitoring result.

6. The method for surface planarization of an object using a light source of a specific wavelength according to claim 5, wherein the controlling of the temperature of the object is performed by heating using an electrode connected to a heating plate to which the object is attached.

7. The method for surface planarization of an object using a light source of a specific wavelength according to claim 1, wherein the light source is formed to have uniform distribution by using a beam shaping lens.

8. The method for surface planarization of an object using a light source of a specific wavelength according to claim 1, wherein the light source has a visible light wavelength band.

9. The method for surface planarization of an object using a light source of a specific wavelength according to claim 1, wherein the film is made of at least one of ITO, FTO, ZnO, $TiO_2$, $SnO_2$, AZO (aluminum-doped ZnO) and GZO (gallium-doped ZnO).

10. The method for surface planarization of an object using a light source of a specific wavelength according to claim 1, wherein the object is selected from silicon (Si), III-IV compound semiconductors, oxide materials and organic polymers.

* * * * *